(12) United States Patent
Jun et al.

(10) Patent No.: US 12,222,367 B2
(45) Date of Patent: Feb. 11, 2025

(54) CONTACT PINS FOR TEST SOCKETS AND TEST SOCKETS COMPRISING THE SAME

(71) Applicant: okins electronics Co.,Ltd, Gyeonggi-do (KR)

(72) Inventors: Jin Kook Jun, Gyeonggi-do (KR); Chan Ho Lee, Gyeonggi-do (KR); Seung Hyun Noh, Gyeongsangnam-do (KR)

(73) Assignee: okins electronics Co., Ltd, Gyeonggi-do (KR)

( * ) Notice: Subject to any disclaimer, the term of this patent is extended or adjusted under 35 U.S.C. 154(b) by 202 days.

(21) Appl. No.: 18/130,431

(22) Filed: Apr. 4, 2023

(65) Prior Publication Data
US 2023/0314472 A1 Oct. 5, 2023

(30) Foreign Application Priority Data
Apr. 5, 2022 (KR) ........................ 10-2022-0042118

(51) Int. Cl.
*G01R 1/04* (2006.01)
*G01R 1/067* (2006.01)
(Continued)

(52) U.S. Cl.
CPC ....... *G01R 1/0466* (2013.01); *G01R 31/2863* (2013.01); *G01R 1/06716* (2013.01); *G01R 1/073* (2013.01)

(58) Field of Classification Search
CPC ... G01R 1/00; G01R 1/02; G01R 1/04; G01R 1/0408; G01R 1/0416; G01R 1/0433; G01R 1/0441; G01R 1/0466; G01R 1/06; G01R 1/067; G01R 1/06711; G01R 1/06716; G01R 1/06733; G01R 1/073; G01R 1/07307; G01R 1/07357; G01R 31/00;
(Continued)

(56) References Cited

U.S. PATENT DOCUMENTS 5,059,135 A * 10/1991 Matsuoka ............ H01R 13/193
439/264
5,952,843 A * 9/1999 Vinh ................. G01R 1/07357
324/754.07
(Continued)

FOREIGN PATENT DOCUMENTS

| JP | S52155388 A | 12/1977 |
|---|---|---|
| JP | H06223936 A | 8/1994 |

(Continued)

*Primary Examiner* — Hoai-An D. Nguyen
(74) *Attorney, Agent, or Firm* — Bayramoglu Law Offices LLC

(57) ABSTRACT

A contact pin for a test socket is provided in the test socket for testing the electrical characteristics of a semiconductor device. The contact pin includes an elastic part elastically deformable in the longitudinal direction of the contact pin; a first contact part which includes a first support part extending from one end of the elastic part and a first contact tip connected to an end of the first support part; and a second contact part which includes a second support part extending from the other end of the elastic part and a second contact tip connected to an end of the second support part, where the elastic part and the second contact part are bent in at least one direction with respect to the first contact part.

13 Claims, 21 Drawing Sheets

(51) Int. Cl.
*G01R 1/073* (2006.01)
*G01R 31/28* (2006.01)

(58) Field of Classification Search
CPC ... G01R 31/28; G01R 31/2851; G01R 31/2855; G01R 31/286; G01R 31/2863
USPC ............ 324/500, 537, 756.01, 756.02
See application file for complete search history.

(56) References Cited

U.S. PATENT DOCUMENTS

| | | | | |
|---|---|---|---|---|
| 6,231,402 B1* | 5/2001 | Kikuchi | ............... | H01R 12/585 |
| | | | | 439/82 |
| 6,655,974 B2* | 12/2003 | Nakano | ............... | H05K 7/1007 |
| | | | | 439/259 |
| 7,264,481 B2* | 9/2007 | Herr | ............... | H01L 24/72 |
| | | | | 439/700 |
| 9,088,113 B2* | 7/2015 | Funayama | ......... | H01R 13/6315 |
| 10,962,564 B2* | 3/2021 | Sasano | ............... | G01R 1/06716 |
| 2006/0186905 A1* | 8/2006 | Kohashi | ............... | G01R 1/0466 |
| | | | | 324/750.25 |
| 2009/0224782 A1 | 9/2009 | Chen et al. | | |
| 2012/0252233 A1* | 10/2012 | Sano | ............... | H01R 12/716 |
| | | | | 439/55 |
| 2022/0255255 A1* | 8/2022 | Kufner | ............... | H01R 13/111 |
| 2023/0314472 A1* | 10/2023 | Jun | ............... | G01R 31/2863 |
| | | | | 324/756.02 |

FOREIGN PATENT DOCUMENTS

| | | |
|---|---|---|
| JP | 2015060622 A | 3/2015 |
| KR | 20060083060 A | 7/2006 |
| KR | 20100110069 A | 10/2010 |
| KR | 20170012773 A | 2/2017 |
| KR | 20190112235 A | 10/2019 |
| TW | 201913109 A | 4/2019 |
| TW | 202041866 A | 11/2020 |
| TW | 202045933 A | 12/2020 |

* cited by examiner

CONTACT PINS FOR TEST SOCKETS AND TEST SOCKETS COMPRISING THE SAME

CROSS-REFERENCE TO THE RELATED APPLICATIONS

This application is based upon and claims priority to Korean Patent Application No. 10-2022-0042118, filed on Apr. 5, 2022, the entire contents of which are incorporated herein by reference.

TECHNICAL FIELD

The present invention relates to test sockets for testing the electrical characteristics of a semiconductor device and contact pins provided in the test sockets.

BACKGROUND

In general, a semiconductor device is manufactured by integrating electronic circuits on a circuit board at a high density, and after the semiconductor device is manufactured, it undergoes an inspection process to check whether the semiconductor device operates correctly before assembling the same into a product.

This inspection operation is performed by inserting the semiconductor device into a test socket, and for this purpose, the test socket has a plurality of contact pins, and when the terminal of the semiconductor device is brought into contact with the contact pins, electricity is energized, and the semiconductor device is inspected by using a test device.

In conventional semiconductor devices, optical pitches with relatively wide pitches, such as pitches between terminals of 1.0 mm and 0.8 mm, have become mainstream, but recently, as the miniaturisation and thinning of semiconductor devices are being accelerated, the pitch of semiconductor devices also becomes narrower and finer (narrower pitch) than the conventional pitch.

Contact pins are formed to be bent in the center so as to be elastically deformable in the longitudinal direction.

A plurality of contact pins are automatically inserted into through-holes that are formed in the housing of the test socket, and if the pitch of the semiconductor device is less than a certain dimension (when the bending state of the contact pins is wider than the pitch), when the contact pins are inserted into the housing of the test socket, they interfere with or collide with neighboring contact pins, resulting in defective contact pins or a problem in which automated insertion is impossible.

As such, since the automatic insertion device cannot be used at a pitch of a certain dimension (e.g., 0.8 mm) or inconvenience occurs in which the contact pins must be inserted into the housing of the test socket by hand while accepting a slight or certain amount of collision.

SUMMARY

An object of the present invention is to provide contact pins for test sockets in which a plurality of contact pins can be formed at a smaller pitch, and it is possible to prevent interference or collision between contact pins when the plurality of contact pins are automatically inserted, and test sockets including the same.

The technical problems to be achieved in the present invention are not limited to the above-mentioned technical problem, and other technical problems that are not mentioned can be clearly understood by those skilled in the art from the description below.

In order to achieve the above-described object, the present invention provides a contact pin for a test socket which is provided in the test socket for testing the electrical characteristics of a semiconductor device, including an elastic part which is elastically deformable in the longitudinal direction of the contact pin; a first contact part which includes a first support part which extends from one end of the elastic part and a first contact tip which is connected to an end of the first support part; and a second contact part which includes a second support part which extends from the other end of the elastic part and a second contact tip which is connected to an end of the second support part, wherein the elastic part and the second contact part are bent in at least one direction with respect to the first contact part.

Herein, the elastic part and the second contact part may be bent in a first direction which is perpendicular to the longitudinal direction and in a second direction which is perpendicular to the first direction, respectively.

In addition, the first contact part and the second contact part may be located on different planes.

In addition, the first contact tip and the second contact tip may be located on different lines.

In addition, the contact pin may be formed with a stopper for restraining the contact pin to the test socket.

In addition, the present invention provides a test socket for testing the electrical characteristics of a semiconductor device, including a housing in which a plurality of first through-holes are formed; a cover in which a plurality of second through-holes are formed; and a plurality of contact pins which are inserted into the plurality of first and second through-holes, wherein the plurality of contact pins include an elastic part which is elastically deformable in the longitudinal direction of the contact pin; a first contact part which includes a first support part which extends from one end of the elastic part and a first contact tip which is connected to an end of the first support part, and is inserted into the plurality of first through-holes; and a second contact part which includes a second support part which extends from the other end of the elastic part and a second contact tip which is connected to an end of the second support part, and is inserted into the plurality of second through-holes, wherein the elastic part and the second contact part are bent in at least one direction with respect to the first contact part before the plurality of contact pins are inserted into the second through-holes.

Herein, the elastic part and the second contact part may be bent in a first direction which is perpendicular to the longitudinal direction and in a second direction which is perpendicular to the first direction before the plurality of contact pins are inserted into the second through-holes, respectively.

In addition, the first contact part and the second contact part may be located on the same plane.

In addition, the first contact tip and the second contact tip may be located on the same line.

In addition, the contact pin may be formed with a stopper for restraining the contact pin to the test socket.

In addition, the plurality of first and second through-holes may be formed in an oblique shape such that the first and second contact tips are located on the second direction axis.

In addition, the first contact part may be inclined at a certain angle such that the first and second contact tips are located on the second direction axis so as to be inserted into the plurality of first through-holes.

In addition, while the second contact part is inserted into the second through-hole, the cover may move the second contact part in the first direction to position the first and second contact tips on the first direction axis.

According to the present invention, it has the effects in which a plurality of contact pins can be formed at a smaller pitch, and it is possible to prevent interference or collision between contact pins when the plurality of contact pins are automatically inserted.

In addition, according to the present invention, since the upper and lower contact tips of the contact pins are located on different lines, the plurality of contact pins can be inserted more densely than those located on the same line, thereby further reducing the pitch between the contact pins.

The effects that can be achieved in the present invention are not limited to the effects mentioned above, and other effects that are not mentioned can be clearly understood by those skilled in the art from the description below.

DETAILED DESCRIPTION OF THE EMBODIMENTS

Figure 1:
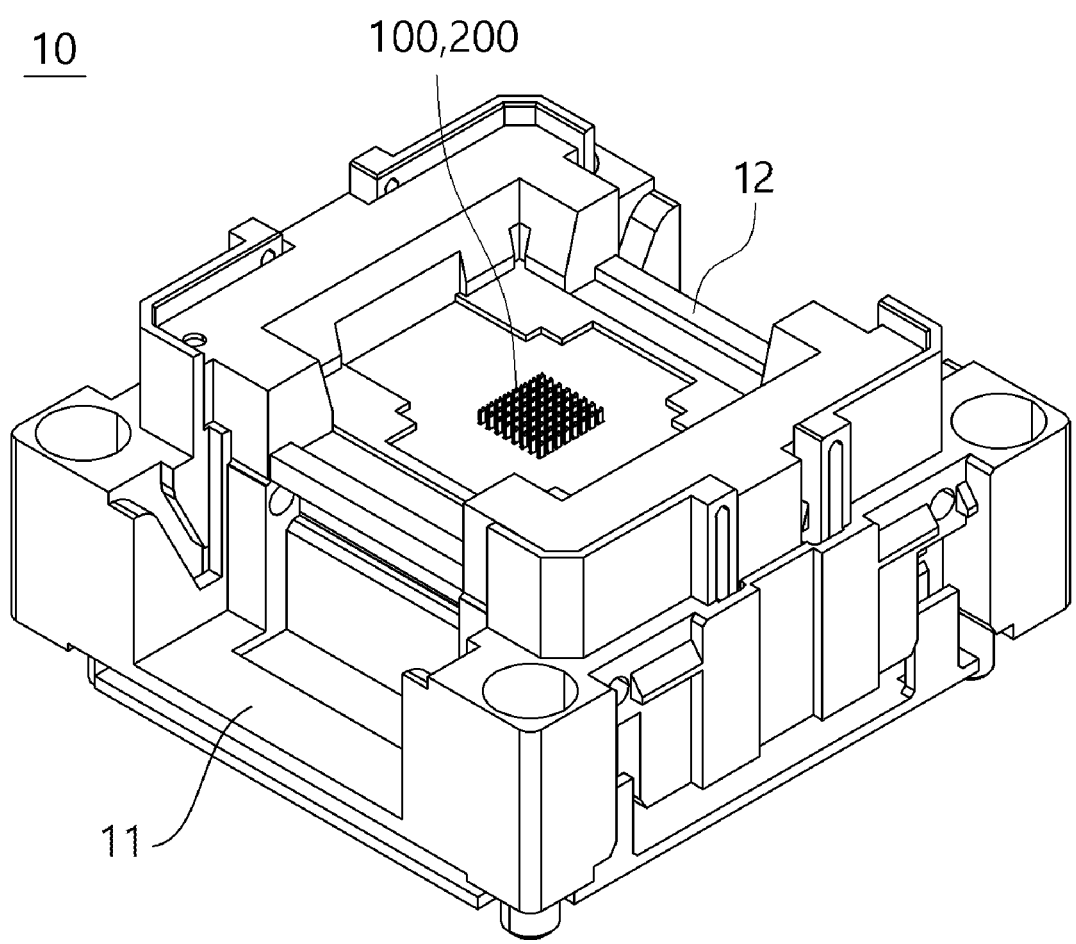
FIG. 1 is a view illustrating test sockets according to the first and second examples of the present invention.

With reference to the accompanying drawings, preferred exemplary embodiments according to the present invention will be described in detail, and the same reference numerals are assigned for the same or similar components regardless of reference numerals in the drawings, and the overlapping description thereof will be omitted.

Further, in terms of describing the present invention, if it is determined that the detailed description of a related known technology may obscure the gist of the present invention, the detailed description thereof will be omitted. In addition, it should be noted that the accompanying drawings are only provided for easily understanding the spirit of the present invention, and should not be construed as limiting the spirit of the present invention by the accompanying drawings.

FIG. 1 is a view illustrating test sockets according to the first and second examples of the present invention.

Referring to FIG. 1, the test socket 10 according to the first and second examples of the present invention may include a housing 11, a cover 12 and a plurality of contact pins 100, 200. Herein, a plurality of through-holes are formed in the housing 11 and the cover 12, and a plurality of contact pins 100, 200 are provided between the housing 11 and the cover 12.

The plurality of through-holes may be formed in a plurality of rows and columns in the housing 11 and the cover 12, and the lower ends of the plurality of contact pins 100, 200 are inserted upright into the through-holes that are formed in the housing 11, and in this state, the upper ends of the plurality of contact pins 100, 200 may be inserted into the through-holes formed in the cover 12.

In the electrical testing of semiconductor devices (not illustrated) such as semiconductor integrated circuit devices, such as package ICs, MCMs and the like, and wafers on which integrated circuits are formed, the test socket 10 is disposed between a semiconductor device and a test device to electrically connect a connection terminal (e.g., a conductive ball) of the semiconductor device to be inspected and a connection terminal (e.g., contact pads) of the test device to each other.

The contact pins 100, 200 electrically connect a connection terminal of the semiconductor device and a connection terminal of the test device to perform an electrical inspection between the semiconductor device and the test device.

The contact pins 100, 200 may be processed (cut and bent) by the precision mold-based press process to improve the price competitiveness and productivity.

The plurality of contact pins 100, 200 may be automatically inserted and assembled into the plurality of through-holes 12 that are formed in the housing 11 through an automatic insertion device (not illustrated).

Figure 2:
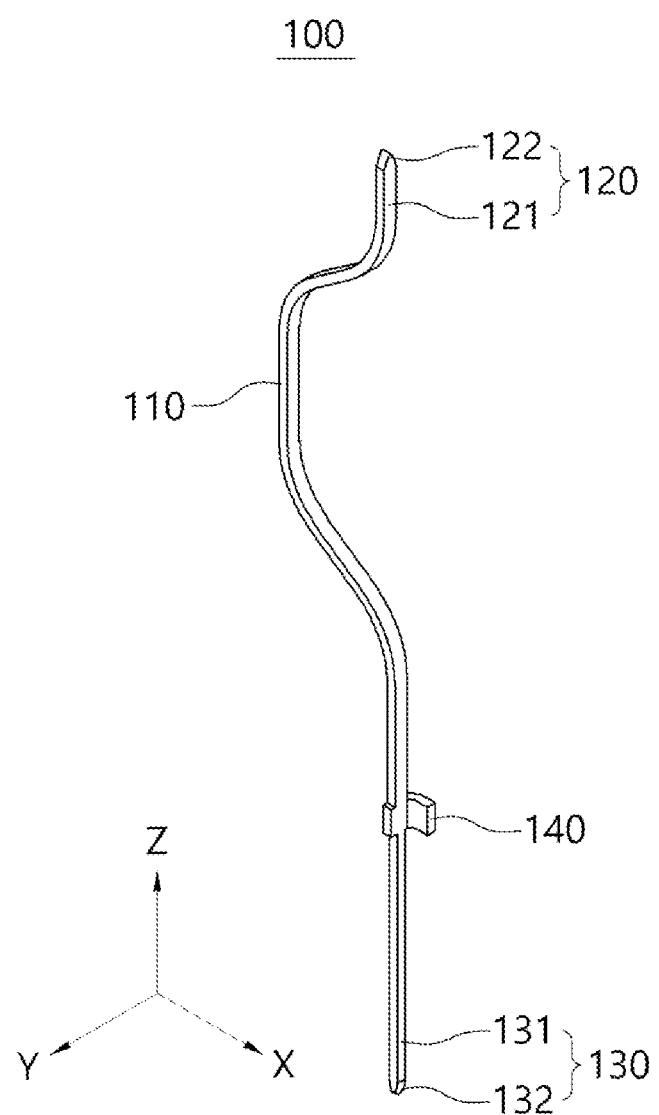
FIG. 2 is a perspective view of a contact pin according to the first example of the present invention.
Figure 3:
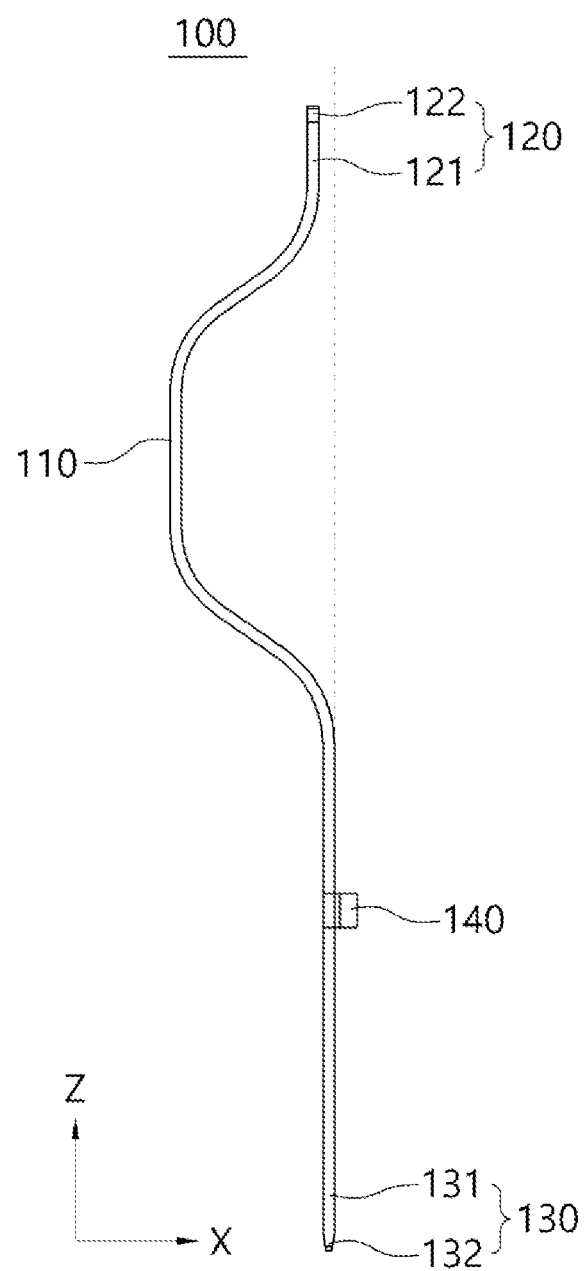
FIG. 3 is a side view of a contact pin according to the first example of the present invention.
Figure 4:
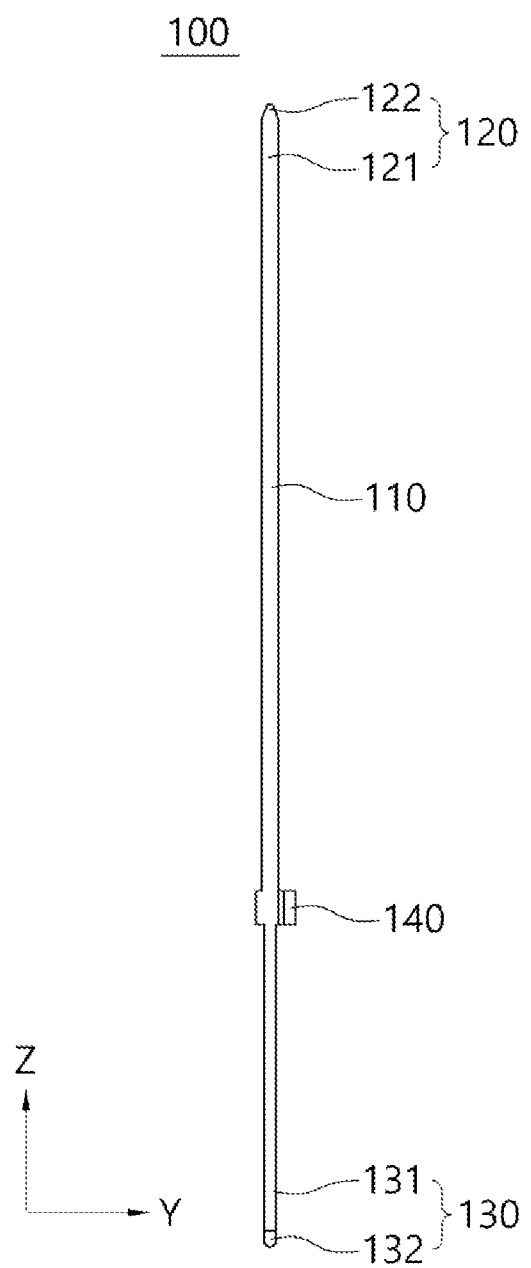
FIG. 4 is another side view of a contact pin according to the first example of the present invention.
Figure 5:
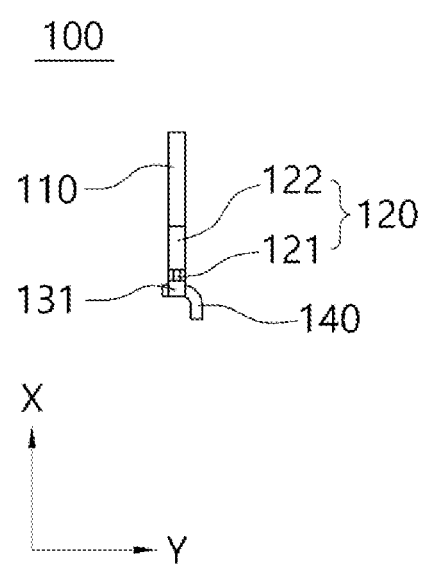
FIG. 5 is a top plan view of a contact pin according to the first example of the present invention.

FIG. 2 is a perspective view of a contact pin according to the first example of the present invention, FIG. 3 is a side view of a contact pin according to the first example of the present invention, FIG. 4 is another side view of a contact pin according to the first example of the present invention, and FIG. 5 is a top plan view of a contact pin according to the first example of the present invention.

Referring to FIGS. 2 to 5, the contact pin 100 may include an elastic part 110, a first contact part 130 and a second contact part 120.

The elastic part 110 may be elastically deformed in the longitudinal direction (z direction) of the contact pin 100 and may be formed in a curved shape, but the present invention is not limited thereto.

The first contact part 130 may include a first support part 131 which extends from one end of the elastic part 110 and a first contact tip 132 which is connected to an end of the first support part 131.

The second contact part 120 may include a second support part 121 which extends from the other end of the elastic part 110 and a second contact tip 122 which is connected to an end of the second support part 121.

The elastic part 110 and the second contact part 120 are bent with respect to the first contact part 130 in a first direction (x direction) which is perpendicular to the longitudinal direction of the contact pin 100.

The elastic part 110 contracts in the longitudinal direction of the contact pin 100 when the conductive ball of a semiconductor device contacts the second contact tip 120 and is pressed, and returns to the original state when the pressure is released. When the first contact tip 130 contacts the contact pad of a test device and the second contact tip 120 contacts the conductive ball of a semiconductor device, the contact pin 100 establishes an electrical signal path between the test device and the semiconductor device. Accordingly, the test device may inspect the electrical characteristics of the semiconductor device.

Referring to FIG. 3, the elastic part 110 may be located on the same plane (xz plane) as the first contact part 130 and the second contact part 120.

In addition, the first contact part 130 and the second contact part 120 may be formed in a straight-line shape or may be positioned on different lines.

A stopper 140 for restraining the contact pin 100 to the housing 11 of the test socket 10 may be formed on one or both sides of the first support part 131 or the second support part 121.

Herein, the contact pin 100 may be moved up and down by the elastic force of the elastic part 110, and in this case, the contact pin 100 may be restrained by the stopper 140 being caught in the through-hole of the housing 11.

Figure 6:
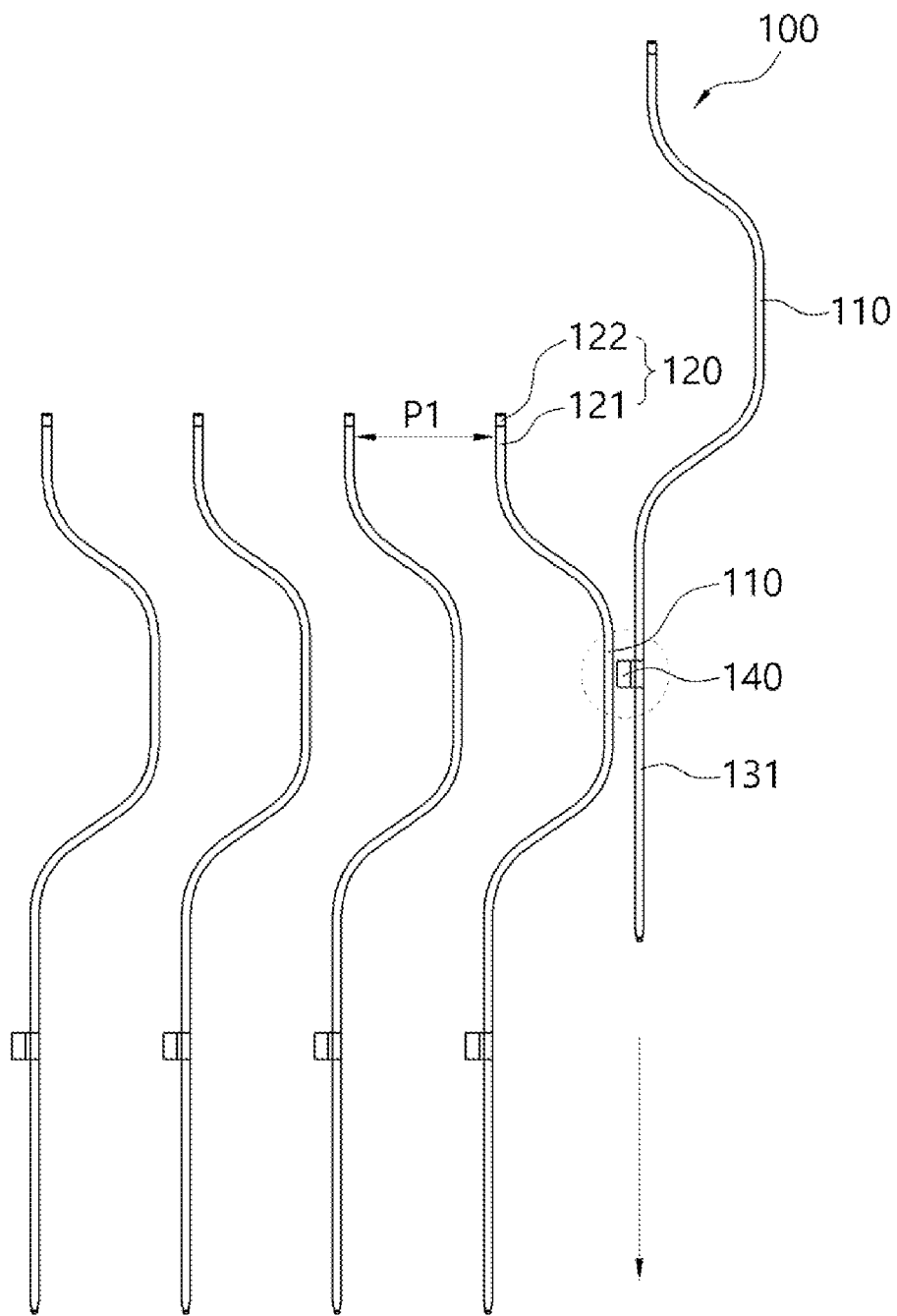
FIGS. 6 and 7 are views for explaining interference between contact pins when the contact pins according to the first example of the present invention are automatically inserted into the test socket.
Figure 7:
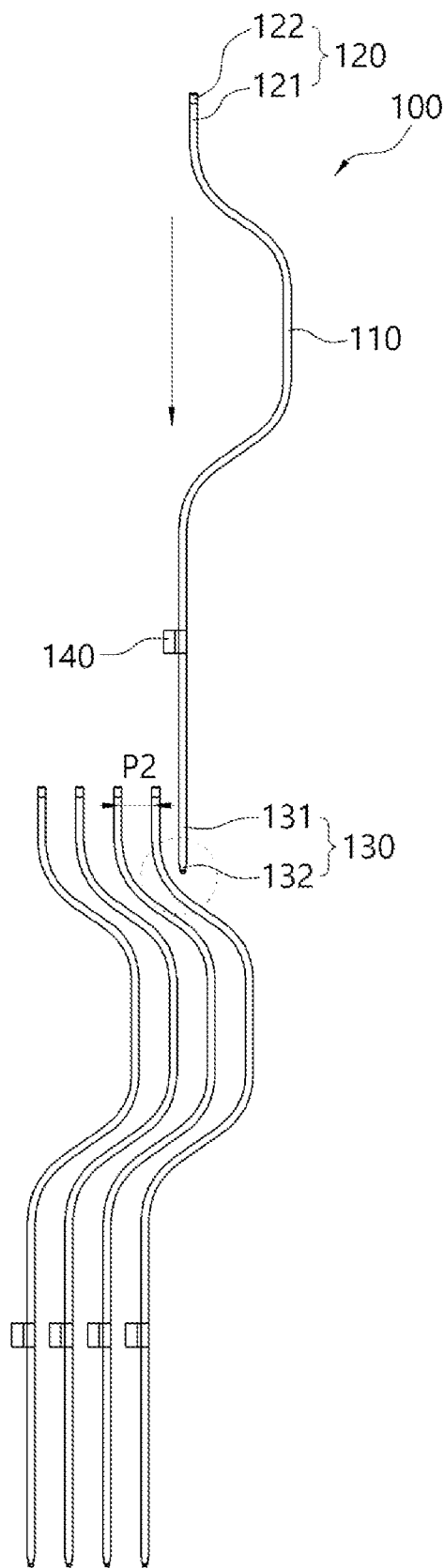

FIGS. 6 and 7 are views for explaining interference between contact pins when the contact pins according to the first example of the present invention are automatically inserted into the test socket.

Referring to FIGS. 6 and 7, the contact pin 100 is inserted upright from the first contact tip 132 into the through-hole formed in the housing 11. In this case, since the elastic part 110 has a curved shape and the first contact part 130 and the second contact part 120 have straight-line shapes, when the contact pin 100 is inserted, the gap between the elastic part 110 and the first contact part 130 or the second contact part 120 of the previously inserted neighboring contact pin 100 becomes the narrowest. Therefore, when the contact pin 100 is inserted, there is a high possibility that this part collides or interferes.

As illustrated in FIG. 6, since the contact pin 100 is bent in the first direction (x direction), the distance between the plurality of contact pins 100 should be greater than or equal to a first pitch P1, in order to prevent collision or interference with the previously inserted adjacent contact pins 100 when inserting the contact pins 100.

That is, as illustrated in FIG. 7, if the gap between the plurality of contact pins 100 is formed at a second pitch P2 that is smaller than the first pitch P1, when the contact pins 100 are inserted, automatic insertion is impossible because collision or interference with the previously inserted adjacent contact pin 100 causes deformation of the contact pin 100.

Figure 8:
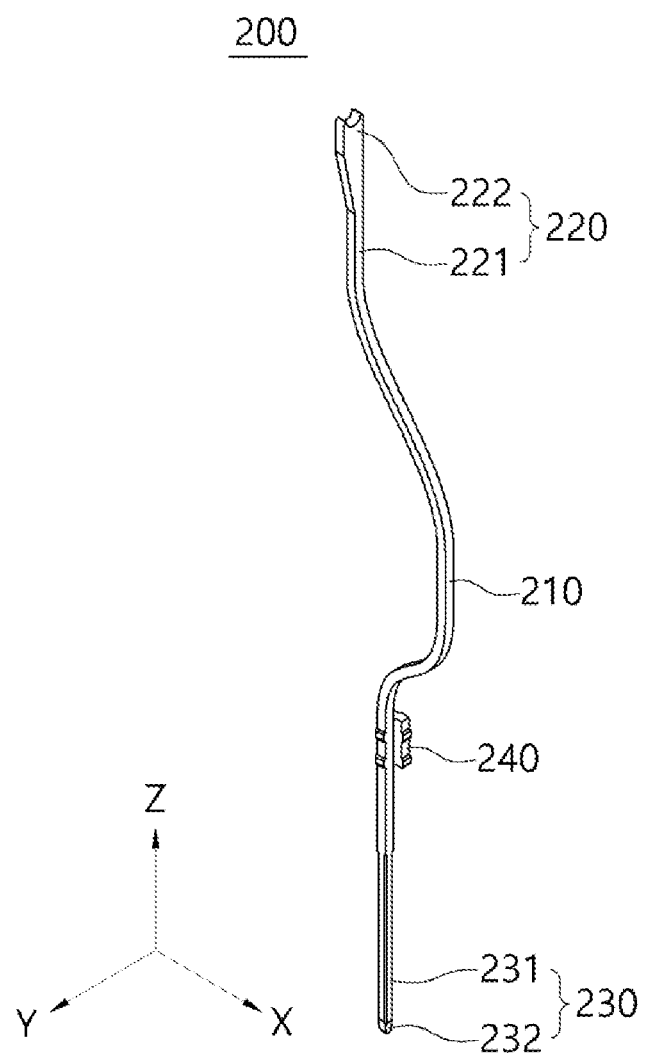
FIG. 8 is a perspective view of a contact pin according to the second example of the present invention.
Figure 9:
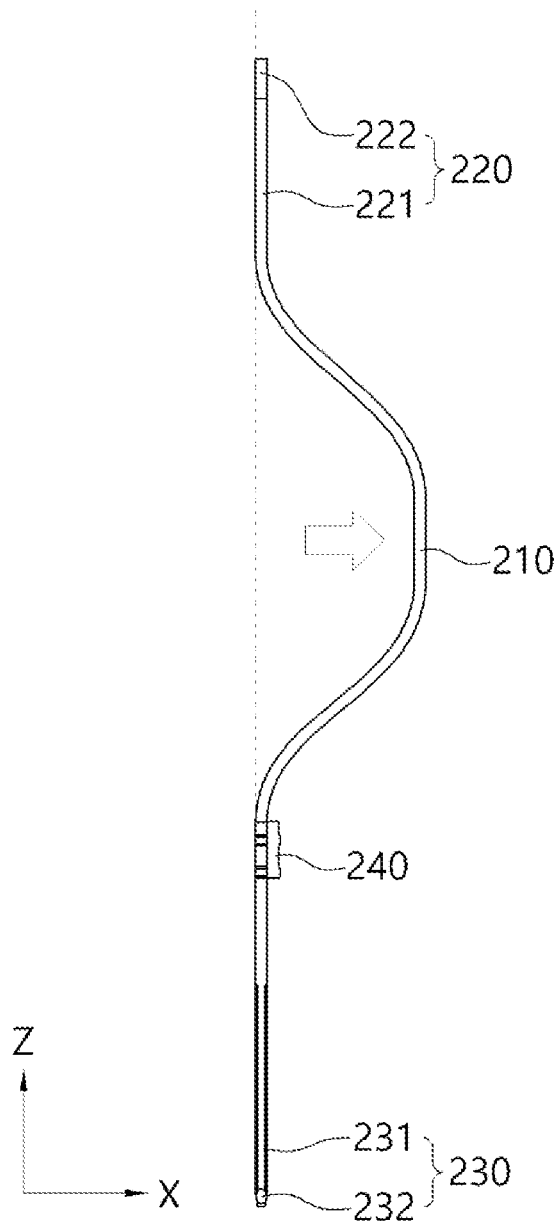
FIG. 9 is a side view of a contact pin according to the second example of the present invention.
Figure 10:
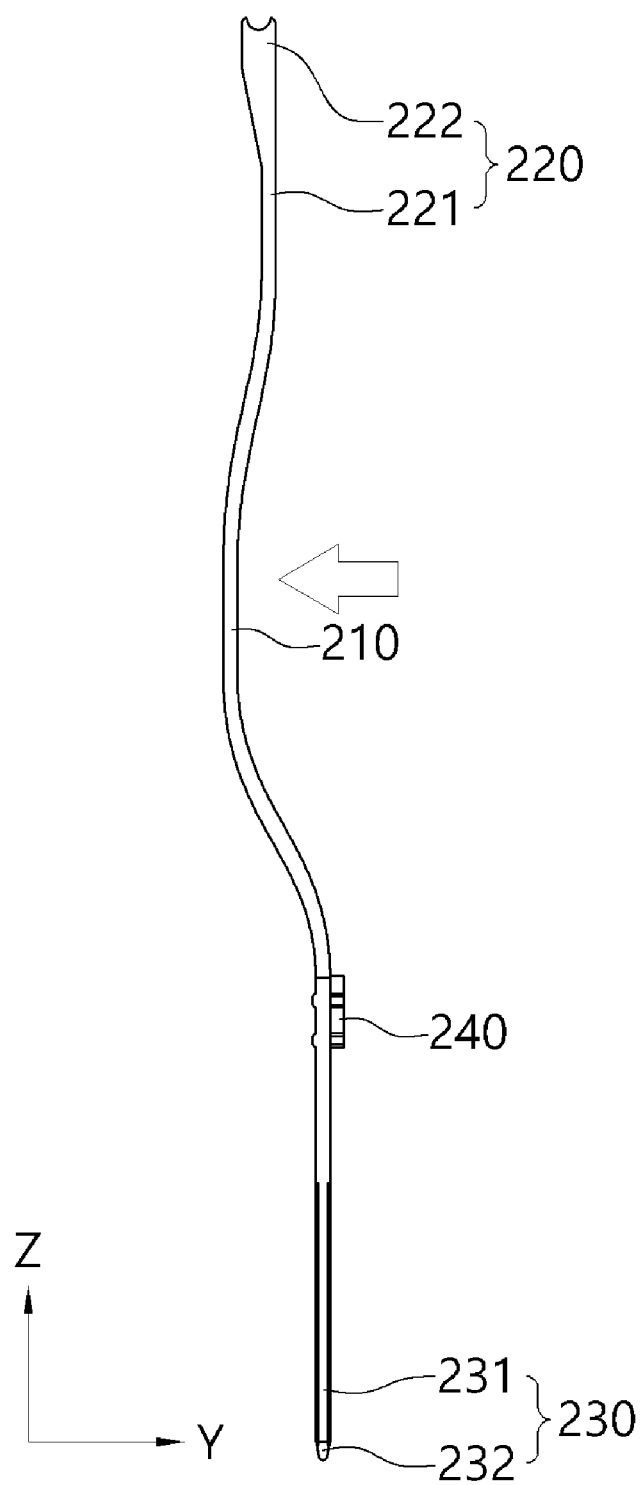
FIG. 10 is another side view of a contact pin according to the second example of the present invention.
Figure 11:
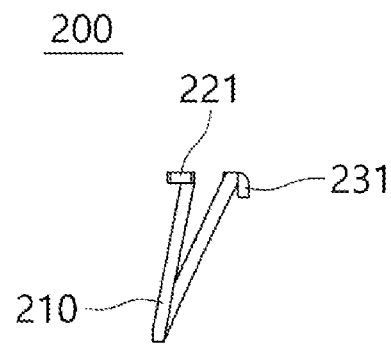
FIG. 11 is a top plan view of a contact pin according to the second example of the present invention.

FIG. 8 is a perspective view of a contact pin according to the second example of the present invention, FIG. 9 is a side view of a contact pin according to the second example of the present invention, FIG. 10 is another side view of a contact pin according to the second example of the present invention, and FIG. 11 is a top plan view of a contact pin according to the second example of the present invention.

Referring to FIGS. 8 to 11, the contact pin 200 may include an elastic part 210, a first contact part 230 and a second contact part 220.

The elastic part 210 may be elastically deformed in the longitudinal direction (z direction) of the contact pin 200 and may be formed in a curved shape, but the present invention is not limited thereto.

The first contact part 230 may include a first support part 231 which extends from one end of the elastic part 210 and a first contact tip 232 which is connected to an end of the first support part 231.

Herein, the first contact tip 232 may come into contact with the contact pad of the test device, and an end thereof may be formed in a needle shape. That is, the first connection tip 232 is a portion that is connected to the contact pad of the test device, and since the contact pad has a substantially flat shape, it may be formed to have a smaller diameter at the end to prevent strong connection and separation.

The second contact part 220 may include a second support part 221 which extends from the other end of the elastic part 210 and a second contact tip 222 which is connected to an end of the second support part 221.

Herein, the second contact tip 222 may come into contact with the conductive ball of the semiconductor device, and an end thereof may be formed in a concave shape corresponding to the shape of the conductive ball of the semiconductor device. Accordingly, it is possible to enhance the contact characteristics and stability of the semiconductor device with the conductive ball.

Unlike the contact pin 100 of the first example, the elastic part 210 and the second contact part 220 are bent in the first direction (x direction) with respect to the first contact part 230 (refer to FIG. 9), and again, it may be bent in the second direction (y direction) with respect to the first contact part 230 (refer to FIG. 10). In this case, the elastic part 210 may be formed by being twisted into a three-dimensional shape in a bent and curved form.

The elastic part 210 may contract in the longitudinal direction of the contact pin 200 when the conductive ball of the semiconductor device contacts the second contact tip 222 and is pressed, and return to the original state when the pressure is released.

When the first contact tip 232 contacts the contact pad of the test device and the second contact tip 222 contacts the conductive ball of the semiconductor device, the contact pin 200 establishes an electrical signal path between the test device and the semiconductor device. Accordingly, the test device may inspect the electrical characteristics of the semiconductor device.

Referring to FIG. 11, since the elastic part 210 is bent in the first direction (x direction) and the second direction (y direction) of the contact pin 200, respectively, the elastic part 210 may be located on a different plane from the first contact part 230 and the second contact part 220.

In addition, referring to FIG. 11, the first contact part 230 and the second contact part 220 may be formed in straight-line shapes and located on different lines.

A stopper 240 for restraining the contact pin 200 to the housing 11 of the test socket 10 may be formed on one or both sides of the first support part 231 or the second support part 221.

Herein, the contact pin 200 may be moved up and down by the elastic force of the elastic part 210, and in this case, the contact pin 200 is restrained by the stopper 240 being caught in the through-hole formed in the housing 11.

Figure 12:
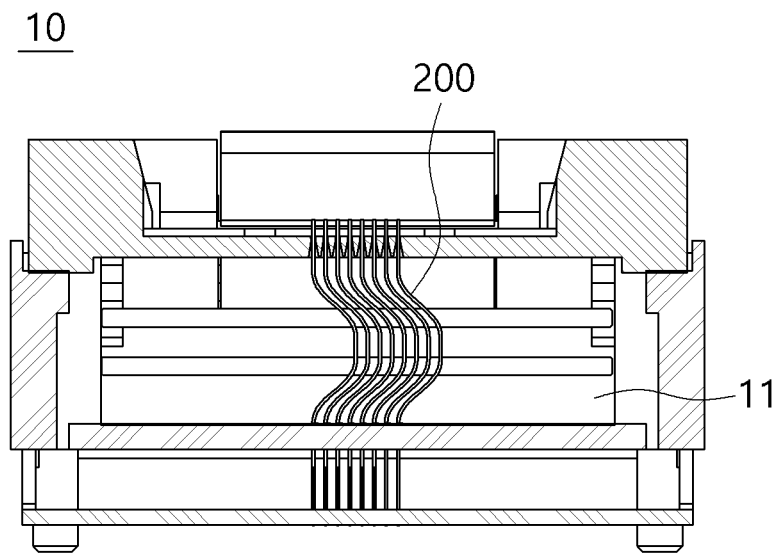
FIG. 12 is a cross-sectional side view of a test socket according to the second example of the present invention.
Figure 13:
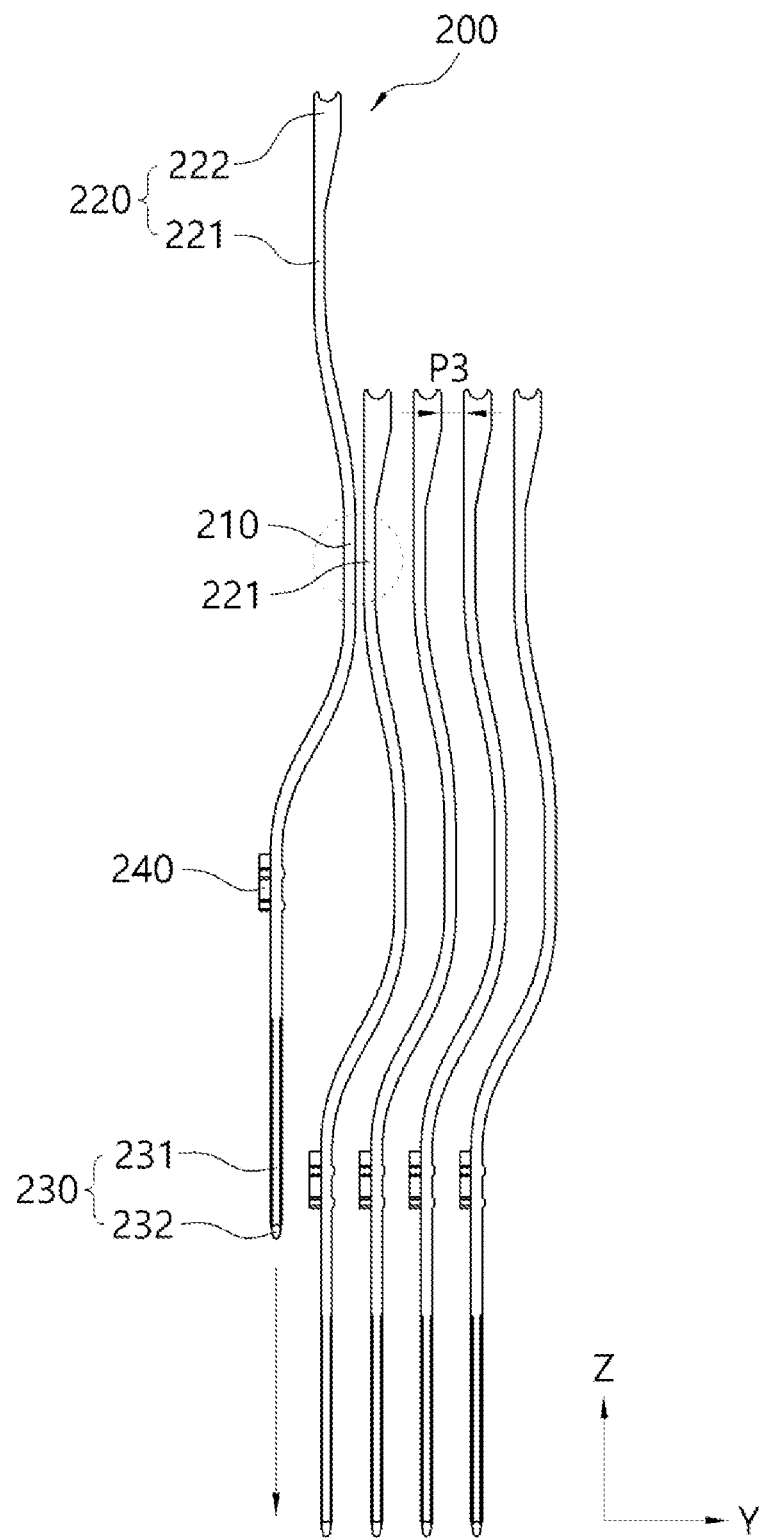
FIG. 13 is another side view of a contact pin according to the second example of the present invention, illustrating the contact pin being inserted into a test socket.
Figure 14:
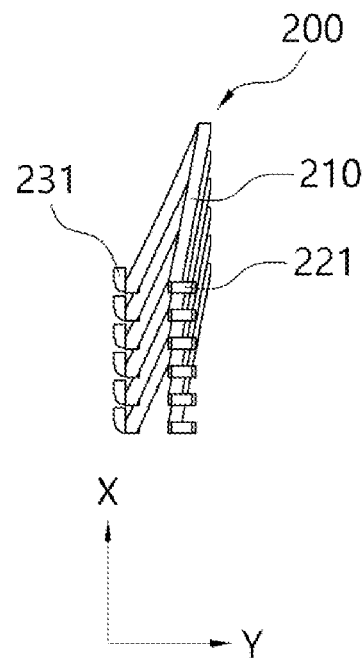
FIG. 14 is a top plan view of a test socket into which contact pins according to the second example of the present invention are inserted.

FIG. 12 is a cross-sectional side view of a test socket according to the second example of the present invention, FIG. 13 is another side view of a contact pin according to the second example of the present invention, illustrating the contact pin being inserted into a test socket, and FIG. 14 is a top plan view of a test socket into which contact pins according to the second example of the present invention are inserted.

Referring to FIGS. 12 to 14, the plurality of contact pins 200 are inserted upright from the first contact tip 232 into the plurality of through-holes that are formed in the housing 11. In this case, since the elastic part 210 has a curved shape and the first contact part 230 and the second contact part 220 have straight-line shapes, when the contact pin 200 is inserted, the gap between the elastic part 210 and the first contact part 230 or the second contact part 220 of the previously inserted neighboring contact pin 200 becomes the narrowest. Therefore, when the contact pin 200 is inserted, there is a high possibility that this part collides or interferes.

Since the elastic part 210 and the second contact part 220 are bent in the first direction (x direction) and the second direction (y direction) with respect to the first contact part 230, when the contact pin 200 is inserted into an area that is bent in the second direction (y direction) of the adjacent contact pin 200, a sufficient insertion space may be secured compared to the contact pin 100 of the first example.

That is, since the elastic part 210 of the previously inserted neighboring contact pin 200 is bent in the second direction (y direction), when another contact pin 200 is inserted into that area, it is possible to present collision or interference with the previously inserted adjacent contact pins 200, even if the gap between the contact pins 200 is formed at a third pitch P3 which is smaller than the first pitch P1 and the second pitch P2.

Therefore, in the test socket according to the second example of the present invention, the plurality of contact pins 200 may be formed at a smaller pitch, and when the plurality of contact pins 200 are automatically inserted, it is possible to prevent interference or collision between the contact pins 200.

In addition, since the first contact tip 232 and the second contact tip 222 are located on different lines, the plurality of contact pins 200 may be inserted more densely than when they are located on the same line, and thus, the pitch between the contact pins 200 may be further reduced.

Figure 15:
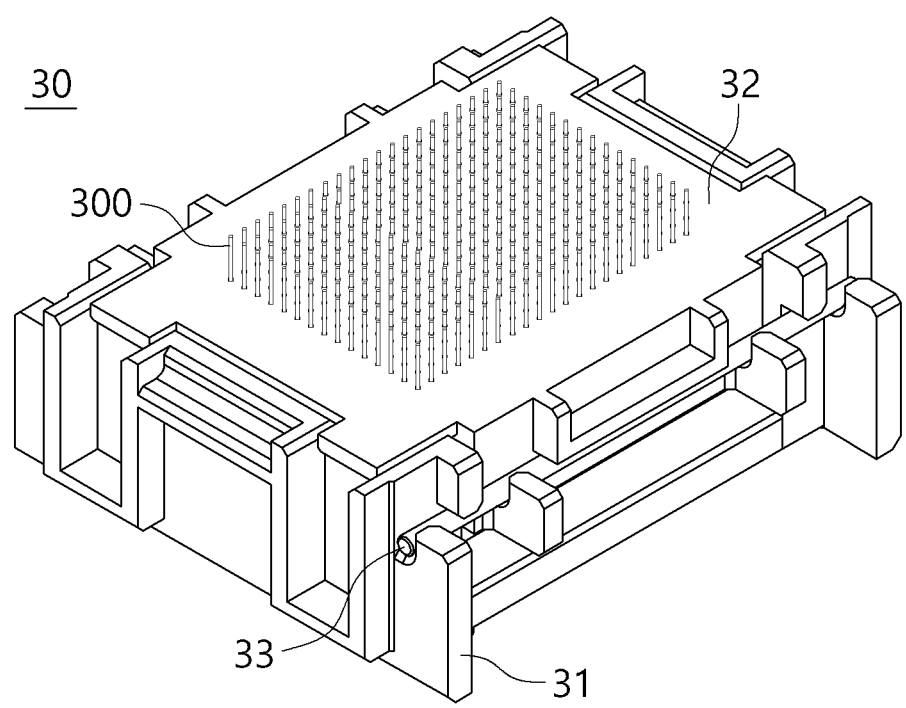
FIG. 15 is an overall perspective view of a test socket according to the third example of the present invention.
Figure 16:
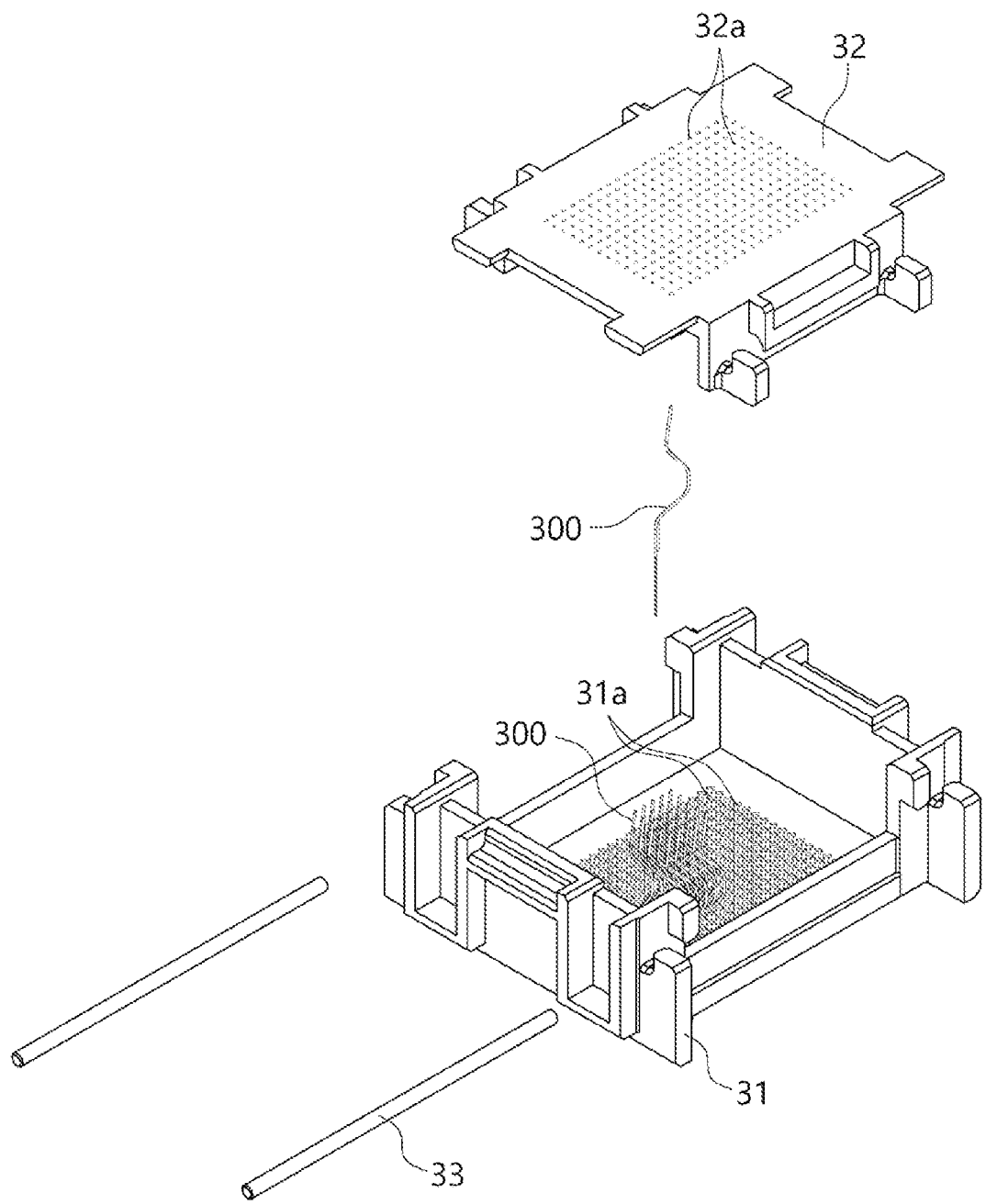
FIG. 16 is an exploded perspective view of a test socket according to the third example of the present invention.

FIG. 15 is an overall perspective view of a test socket according to the third example of the present invention, and FIG. 16 is an exploded perspective view of a test socket according to the third example of the present invention.

Referring to FIGS. 15 and 16, the test socket 30 according to the third example of the present invention may be configured by including a housing 31, a cover 32, a fixing bar 33 and a plurality of contact pins 300. Herein, the housing 31 is formed with a plurality of first through-holes 31a, the cover 32 is formed with a plurality of second through-holes 32a, and the plurality of contact pins 300 are provided between the housing 31 and the cover 32.

The plurality of first through-holes 31a may be formed in a plurality of rows and columns in the housing 31, and the plurality of second through-holes 32a may be formed in a plurality of rows and columns in the cover 12.

The lower ends of the plurality of contact pins 320 are inserted upright into the first through-holes 31a that are formed in the housing 31, and in this state, the upper ends of the plurality of contact pins 300 may be inserted into the second through-holes 32a that are formed in the cover 32.

In the electrical testing of semiconductor devices (not illustrated), such as semiconductor integrated circuit devices such as package ICs, MCMs and the like, and wafers on which integrated circuits are formed, the test socket 30 is disposed between a semiconductor device and a test device to electrically connect a connection terminal (e.g., a conductive ball) of the semiconductor device to be inspected and a connection terminal (e.g., a contact pad) of the test device to each other.

The contact pin 300 electrically connects the connection terminal of the semiconductor device and the connection terminal of the test device to perform an electrical inspection between the semiconductor device and the test device.

The contact pin 300 may be processed (cut and bent) by the precision mold-based press process to improve the price competitiveness and productivity.

The plurality of contact pins 300 may be automatically inserted and assembled into the plurality of first through-holes 31a that are formed in the housing 31 through an automatic insertion device (not illustrated).

When the assembly of the plurality of contact pins 300 between the housing 31 and the cover 32 is completed, the housing 31 and the cover 32 may be fixed by the fixing bar 33 such that the housing 31 and the cover 32 are not separated.

Figure 17:
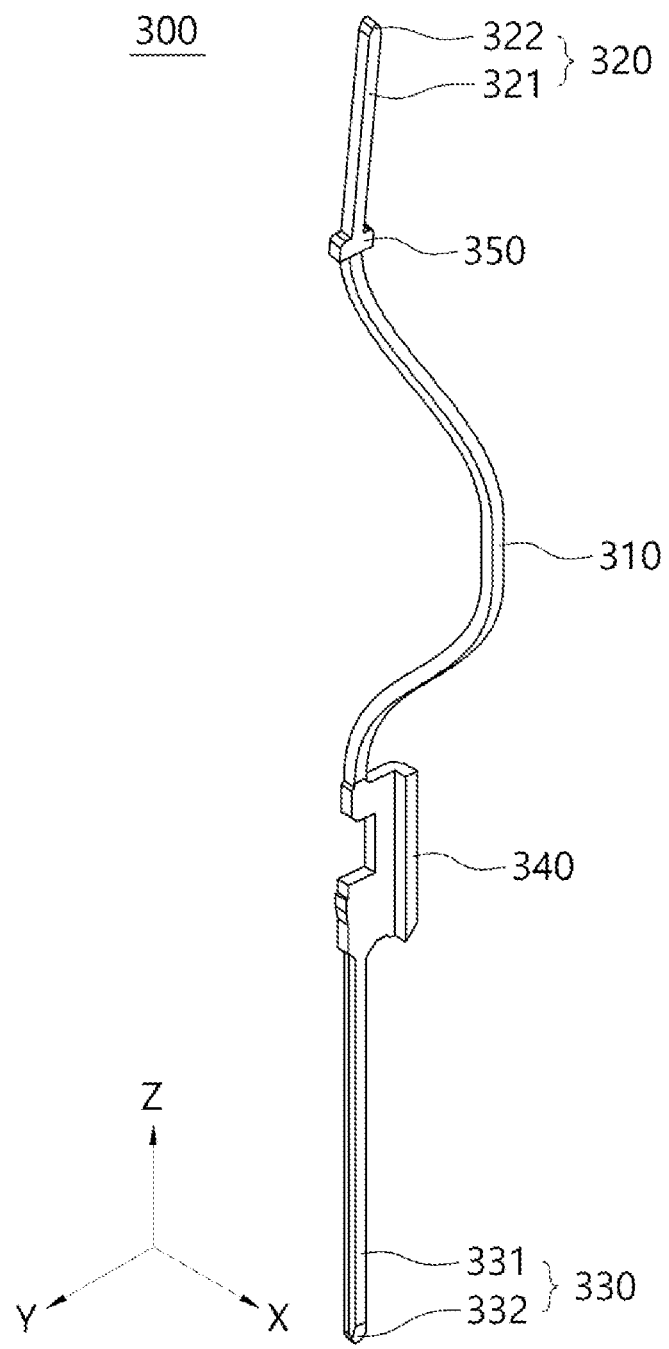
FIG. 17 is a perspective view of a contact pin according to the third example of the present invention.
Figure 18:
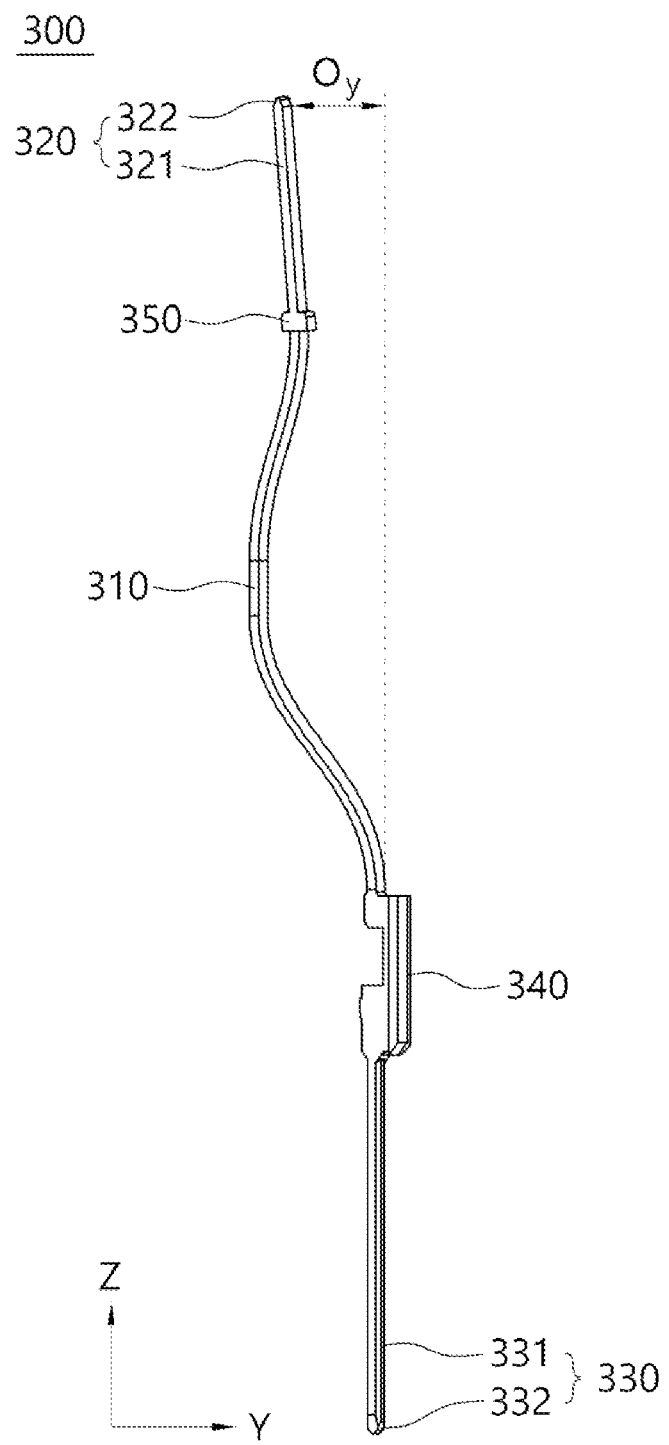
FIG. 18 is a side view of a contact pin according to the third example of the present invention.
Figure 19:
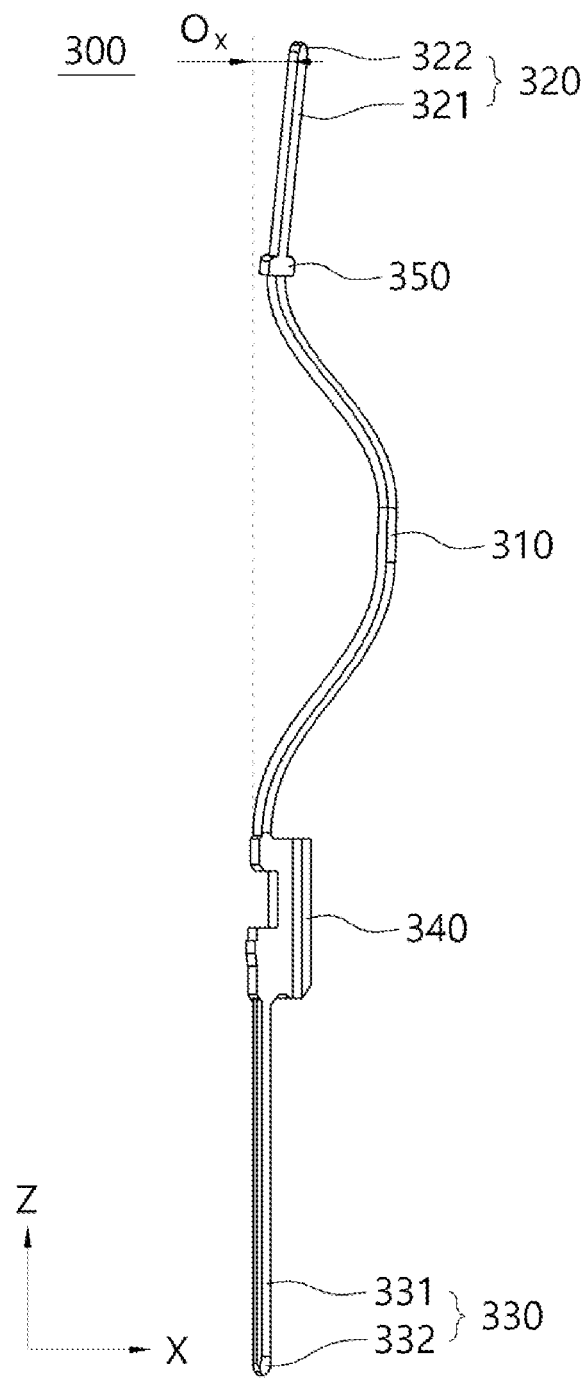
FIG. 19 is another side view of a contact pin according to the third example of the present invention.
Figure 20:
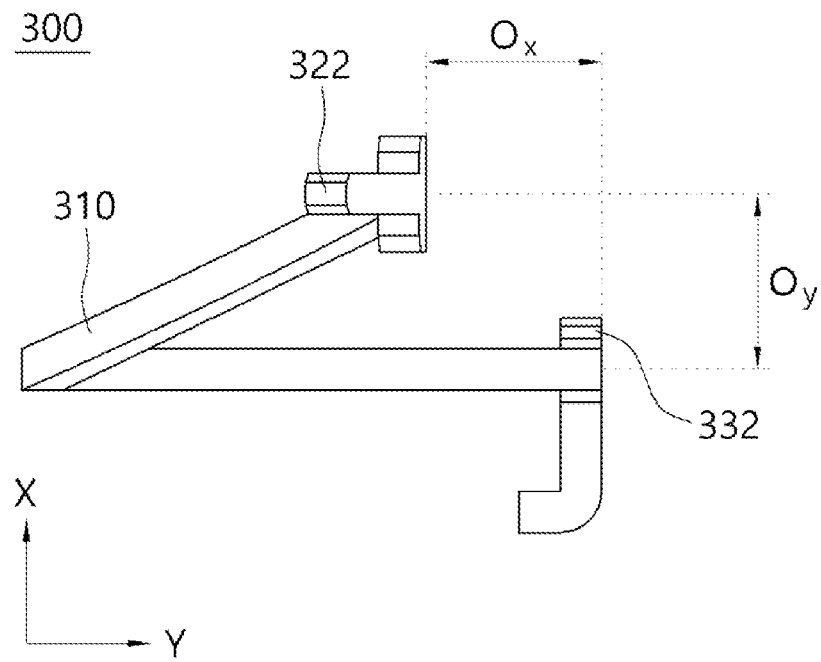
FIG. 20 is a top plan view of a contact pin according to the third example of the present invention.

FIG. 17 is a perspective view of a contact pin according to the third example of the present invention, FIG. 18 is a side view of a contact pin according to the third example of the present invention, FIG. 19 is another side view of a contact pin according to the third example of the present invention, and FIG. 20 is a top plan view of a contact pin according to the third example of the present invention.

Referring to FIGS. 17 to 20, the contact pin 300 may include an elastic part 310, a first contact part 330 and a second contact part 320.

The elastic part 310 may be elastically deformed in the longitudinal direction (z direction) of the contact pin 300 and may be formed in a curved shape, but the present invention is not limited thereto.

The first contact part 330 may include a first support part 331 which extends from one end of the elastic part 310 and a first contact tip 332 which is connected to an end of the first support part 331. Herein, the first contact tip 332 may come into contact with a contact pad of the test device.

The second contact part 320 may include a second support part 321 which extends from the other end of the elastic part 310 and a second contact tip 322 which is connected to an end of the second support part 321. Herein, the second contact tip 322 may come into contact with a conductive ball of the semiconductor device.

The elastic part 310 contracts in the longitudinal direction of the contact pin 300 when the conductive ball of the semiconductor device contacts the second contact tip 322 and is pressed, and returns to the original state when the pressure is released.

Unlike the contact pin 100 of the first example, the elastic part 310 and the second contact part 320 are bent in the first direction (x direction) with respect to the first contact part 330 (refer to FIG. 19), and again, it may be bent in the second direction (y direction) with respect to the first contact part 330 (refer to FIG. 18). In this case, the elastic part 310 may be formed by being twisted into a three-dimensional shape as a bent and curved form.

When the first contact tip 332 contacts the contact pad of the test device and the second contact tip 322 contacts the conductive ball of the semiconductor device, the contact pin 300 establishes an electrical signal path between the test device and the semiconductor device. Accordingly, the test device may inspect the electrical characteristics of the semiconductor device.

Referring to FIGS. 18 to 20, since the elastic part 210 is bent in the first direction (x direction) and the second direction (y direction) of the contact pin 200, respectively, the elastic part 310 may be located on a different plane from the first contact part 330 and the second contact part 320.

In addition, the first contact part 330 and the second contact part 320 may be formed in straight-line shapes and may be located on different lines.

Accordingly, the contact pin 300 may generate an offset Ox in the first direction (x direction) and an offset Oy in the second direction (y direction) between the first contact tip 332 and the second contact tip 322.

The first support part 331 or the second support part 321 may be formed with a first stopper 340 and a second stopper 350 on one or both sides for restraining the contact pin 300 to the housing 31 and the cover 32 of the test socket 30.

Herein, the contact pin 300 may be moved up and down by the elastic force of the elastic part 310, and in this case, the contact pin 300 is restrained by being caught by the first and second stoppers 340, 350 in the first and second through-holes 31a, 32a.

Figure 21:
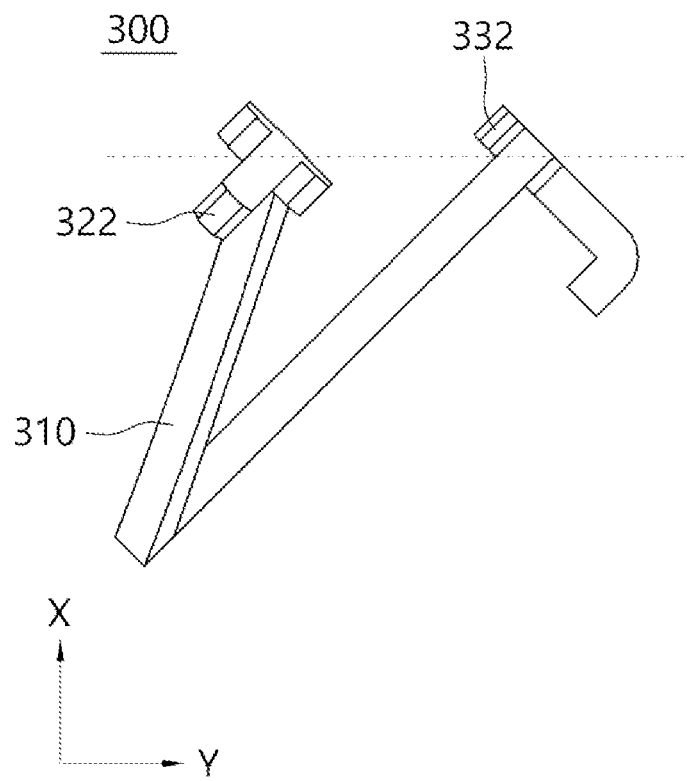
FIG. 21 is a view showing a state before insertion of a contact pin according to the third example of the present invention.
Figure 22:
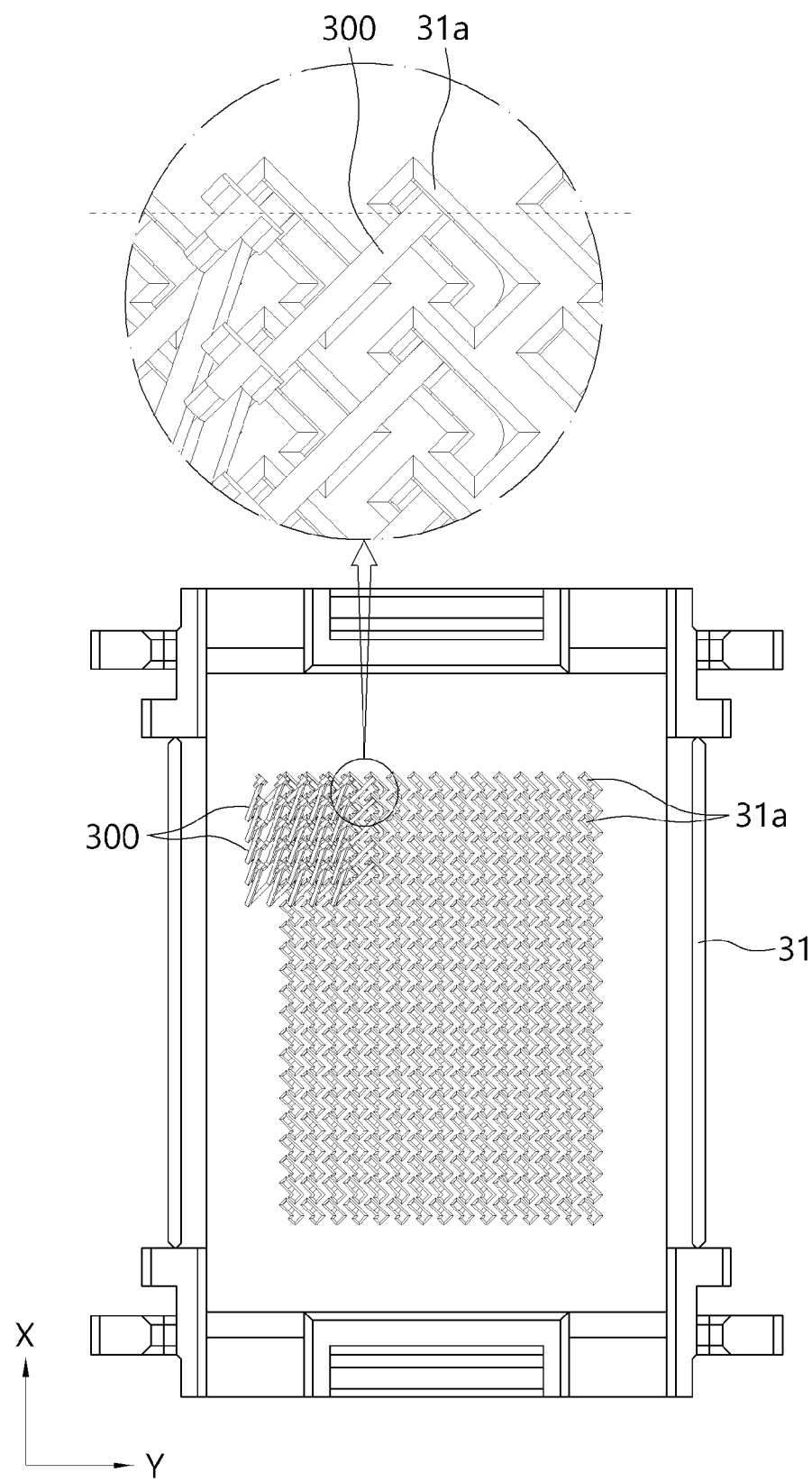
FIG. 22 is a view showing a state in which the contact pin according to the third embodiment of the present invention is inserted into the housing.

FIG. 21 is a view showing a state before insertion of a contact pin according to the third example of the present invention, and FIG. 22 is a view showing a state in which the contact pin according to the third embodiment of the present invention is inserted into the housing.

Referring to FIGS. 21 and 22, the plurality of contact pins 300 are inserted upright from the first contact tips 332 into the plurality of first through-holes 31a that are formed in the housing 11.

Specifically, the plurality of contact pins 300 are inclined at a certain angle such that the first contact tips 332 and the second contact tips 322 are located on the second direction (y direction) axis so as to be inserted into a plurality of first through-holes 31a. For example, when the offset Ox in the first direction (x direction) and the offset Oy in the second direction (y direction) between the first contact tip 332 and the second contact tip 322 are the same, a plurality of contact pins 300 are inclined at an angle of 45 degrees and inserted into the plurality of first through-holes 31a.

Herein, the plurality of first through-holes 31a and second through-holes 32a are formed in an oblique shape such that the first contact tips 332 and the second contact tips 322 are located on the second direction (y direction) axis. For example, when the offset Ox in the first direction (x direction) and the offset Oy in the second direction (y direction) between the first contact tip 332 and the second contact tip 322 are the same, the plurality of first through-holes 31a and the second through-holes 32a may be formed in an oblique shape that is inclined at an angle of 45 degrees.

Accordingly, it is possible to remove the offset Oy in the second direction (y direction) between the first contact tip 332 and the second contact tip 322.

In this case, since the elastic part 310 has a curved shape and the first contact part 330 and the second contact part 320 have straight-line shapes, when the contact pin 300 is inserted, the gap between the elastic part 310 and the first contact part 330 or the second contact part 320 of the previously inserted neighboring contact pin 300 becomes the narrowest. Therefore, when the contact pin 300 is inserted, there is a high possibility that this part collides or interferes.

The elastic part 310 and the first contact part 330 are bent in the first direction (x direction) and the second direction (y direction) with respect to the second contact part 320, and since the plurality of contact pins 300 are inclined at a certain angle such that the first contact tips 332 and the second contact tips 322 are located on the second direction (y direction) axis so as to be inserted into the plurality of first through holes 31a, it is possible to secure a more sufficient insertion space compared to the contact pin 200 of the second example.

Accordingly, even if the gap between the contact pins 300 is formed at a pitch that is smaller than the third pitch P3, it is possible to prevent collision or interference with the previously inserted adjacent contact pins 300.

Therefore, in the test socket 30 according to the third example of the present invention, the plurality of contact pins 300 may be formed at a pitch that is smaller than that of the second example, and it is possible to prevent interference or collision between the contact pins 300 when the plurality of contact pins 300 are automatically inserted.

In addition, since the first contact tip 332 and the second contact tip 322 are located on different lines, the plurality of contact pins 200 may be inserted more densely than those located on the same line.

Figure 23:
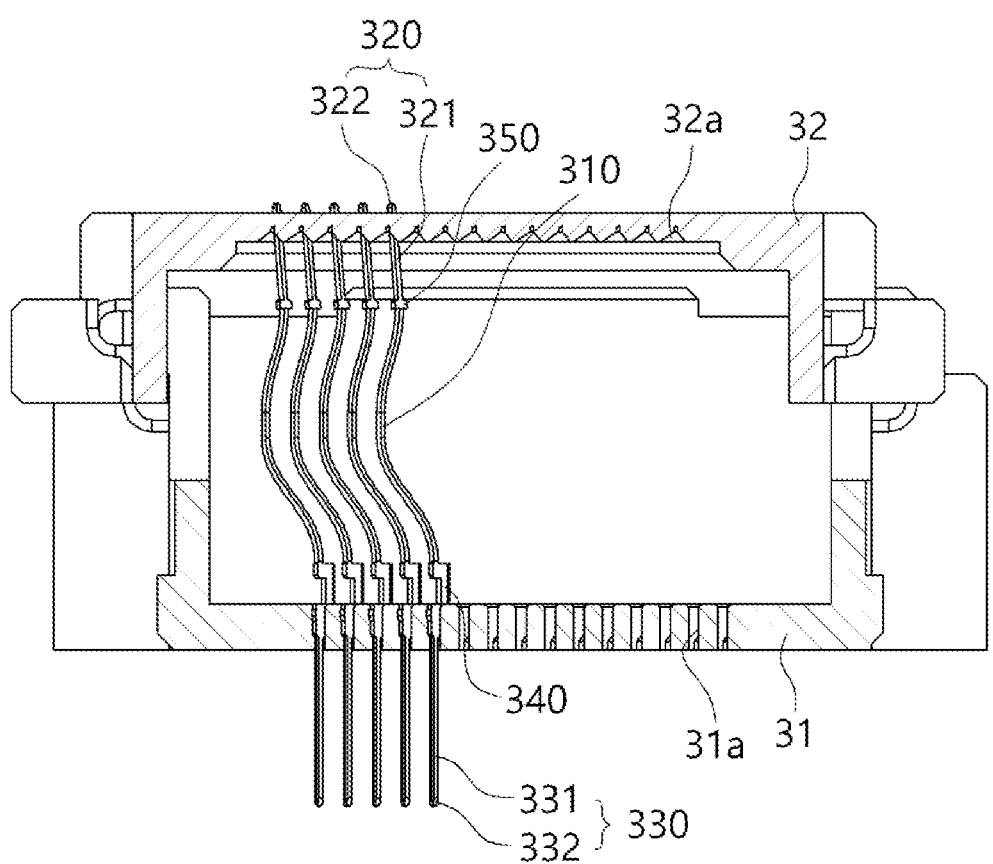
FIGS. 23 and 24 are diagrams for explaining the method of assembling a test socket according to the third example of the present invention.
Figure 24:
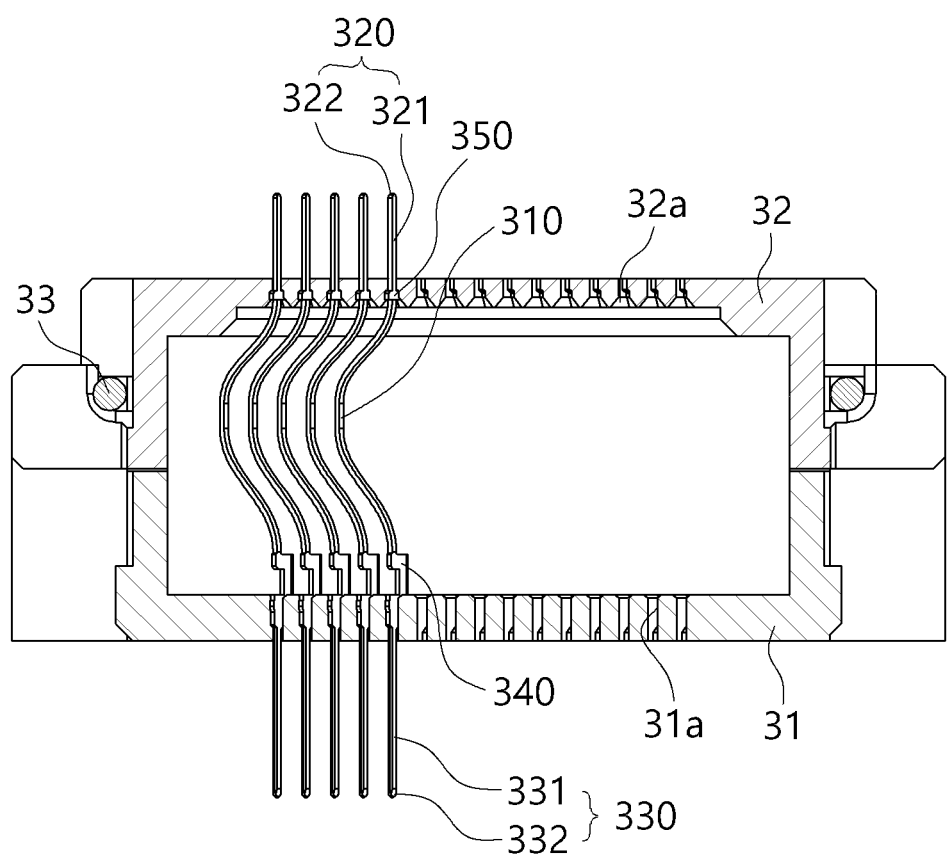

FIGS. 23 and 24 are diagrams for explaining the method of assembling a test socket according to the third example of the present invention.

Referring to FIG. 23, while the first contact parts 330 of the plurality of contact pins 300 are inserted into the first through holes 31a, the second contact parts 320 are inserted into the plurality of second through-holes 32a that are formed in the cover 32. In this case, there exists an offset Ox in the first direction (x direction) between the first contact tip 332 and the second contact tip 322.

Thereafter, while the second contact parts 320 are inserted into the second through-hole 32a, the cover 32 moves the second contact parts 320 in the first direction (x direction) to position the first contact tip 332 and the second contact tip 322 on the first direction (x direction) axis.

In this case, even if the second contact part 320 is moved in the first direction (x direction), interference or collision between the contact pins 300 does not occur.

Accordingly, it is possible to remove an offset Ox in the first direction (x direction) between the first contact tip 332 and the second contact tip 322. That is, the first contact tip 332 and the second contact tip 322 are located on the same line, and thus, the pitch between the contact pins 300 may be further reduced.

When the plurality of contact pins 300 are assembled between the housing 31 and the cover 32, the housing 31 and the cover 32 are fixed by the fixing bar 33 so as not to be separated.

The exemplary embodiments described in the present specification and the accompanying drawings merely illustrate some of the technical ideas included in the present invention by way of example. Therefore, since the exemplary embodiments disclosed in the present specification are not intended to limit the technical spirit of the present invention but to describe the same, it is apparent that the scope of the technical spirit of the present invention is not limited by these exemplary embodiments. All modified examples and specific examples that can be easily inferred by those skilled in the art within the scope of the technical spirit included in the specification and drawings of the present invention will be interpreted as being included in the scope of the present invention.

What is claimed is:

1. A contact pin for a test socket, the contact pin being provided in the test socket for testing electrical characteristics of a semiconductor device, comprising:
   an elastic part, wherein the elastic part is elastically deformable in a longitudinal direction of the contact pin;
   a first contact part, wherein the first contact part comprises a first support part extending from a first end of the elastic part and a first contact tip connected to an end of the first support part; and
   a second contact part, wherein the second contact part comprises a second support part extending from a second end of the elastic part and a second contact tip connected to an end of the second support part,
   wherein the elastic part and the second contact part are bent in at least one direction with respect to the first contact part.

2. The contact pin of claim 1, wherein the elastic part and the second contact part are bent in a first direction perpendicular to the longitudinal direction and in a second direction perpendicular to the first direction, respectively.

3. The contact pin of claim 1, wherein the first contact part and the second contact part are located on different planes.

4. The contact pin of claim 1, wherein the first contact tip and the second contact tip are located on different lines.

5. The contact pin of claim 1, wherein the contact pin is formed with a stopper for restraining the contact pin to the test socket.

6. A test socket for testing electrical characteristics of a semiconductor device, comprising:
   a housing, wherein a plurality of first through-holes are formed in the housing;
   a cover, wherein a plurality of second through-holes are formed in the cover; and
   a plurality of contact pins, wherein the plurality of contact pins are inserted into the plurality of first through-holes and the plurality of second through-holes,
   wherein the plurality of contact pins comprise:
   an elastic part, wherein the elastic part is elastically deformable in a longitudinal direction of the contact pin;
   a first contact part, wherein the first contact part comprises a first support part extending from a first end of the elastic part and a first contact tip connected to an end of the first support part, and the first contact part is inserted into the plurality of first through-holes; and
   a second contact part, wherein the second contact part comprises a second support part extending from a second end of the elastic part and a second contact tip connected to an end of the second support part, and the second contact part is inserted into the plurality of second through-holes,
   wherein the elastic part and the second contact part are bent in at least one direction with respect to the first contact part before the plurality of contact pins are inserted into the plurality of second through-holes.

7. The test socket of claim 6, wherein the elastic part and the second contact part are bent in a first direction perpendicular to the longitudinal direction and in a second direction perpendicular to the first direction before the plurality of contact pins are inserted into the plurality of second through-holes, respectively.

8. The test socket of claim 6, wherein the first contact part and the second contact part are located on a same plane.

9. The test socket of claim 6, wherein the first contact tip and the second contact tip are located on a same line.

10. The test socket of claim 6, wherein the contact pin is formed with a stopper for restraining the contact pin to the test socket.

11. The test socket of claim 7, wherein the plurality of first through-holes and the plurality of second through-holes are formed in an oblique shape such that the first contact tip and the second contact tip are located on a second direction axis.

12. The test socket of claim 7, wherein the first contact part is inclined at a certain angle such that the first contact tip and the second contact tip are located on a second direction axis so as to be inserted into the plurality of first through-holes.

13. The test socket of claim 12, wherein while the second contact part is inserted into the plurality of second through-holes, the cover moves the second contact part in the first direction to position the first contact tip and the second contact tip on a first direction axis.

* * * * *